US009231594B2

(12) United States Patent
Afshar et al.

(10) Patent No.: US 9,231,594 B2
(45) Date of Patent: *Jan. 5, 2016

(54) NON-LUT FIELD-PROGRAMMABLE GATE ARRAYS

(71) Applicant: Ecole Polytechnique Federale de Lausanne (EPFL), Lausanne (CH)

(72) Inventors: Hadi Parandeh Afshar, San Diego, CA (US); David Novo Bruna, Lausanne (CH); Paolo Ienne Lopez, Pully (CH); Grace Zgheib, Lausanne (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 0 days.

This patent is subject to a terminal disclaimer.

(21) Appl. No.: 14/458,456

(22) Filed: Aug. 13, 2014

(65) Prior Publication Data

US 2014/0347096 A1  Nov. 27, 2014

Related U.S. Application Data

(63) Continuation-in-part of application No. 13/333,229, filed on Dec. 21, 2011, now Pat. No. 8,836,368.

(51) Int. Cl.
*H03K 19/20* (2006.01)
*H03K 19/173* (2006.01)
(Continued)

(52) U.S. Cl.
CPC ........ *H03K 19/17728* (2013.01); *H03K 17/002* (2013.01); *H03K 19/1737* (2013.01); *H03K 19/17736* (2013.01)

(58) Field of Classification Search
CPC ............... H03K 19/17728; H03K 19/1733; H03K 19/177; H03K 19/17796; H03K 19/1737; H03K 19/17736; H03K 17/002; G06F 15/7867
USPC .................................................... 326/38–41
See application file for complete search history.

(56) References Cited

U.S. PATENT DOCUMENTS

| 4,789,951 A | 12/1988 | Birkner et al. |
| 5,553,276 A * | 9/1996 | Dean ............................. 713/500 |
| 6,208,166 B1 | 3/2001 | Carro |

(Continued)

OTHER PUBLICATIONS

J. Cong and Y. Ding. An optimal technology mapping algorithm for delay optimization in lookup-table based FPGA designs. In Proceedings of the International Conference on Computer Aided Design, pp. 49-53, Santa Clara, Calif., Nov. 1992.

(Continued)

*Primary Examiner* — Vibol Tan
(74) *Attorney, Agent, or Firm* — Brian Michaelis; Seyfarth Shaw LLP

(57) ABSTRACT

New logic blocks capable of replacing the use of Look-Up Tables (LUTs) in integrated circuits, such as Field-Programmable Gate Arrays (FPGAs), are disclosed herein. In one embodiment, the new logic block is a tree structure comprised of a number of levels of cells with each cell consisting of a logic gate or the functional equivalent of a logic gate, one or more selectable inverters, and wherein the inputs of the logic block consist of the inputs to the logic gate or functional equivalent of the logic gate and inputs to the selectable inverters. The new logic blocks can map circuits more efficiently than LUTs, because they include multi-output blocks and can cover more logic depth due to the higher input and output bandwidth.

22 Claims, 10 Drawing Sheets

(51) Int. Cl.
*H03K 19/177* (2006.01)
*H03K 17/00* (2006.01)

(56) References Cited

U.S. PATENT DOCUMENTS

| | | | |
|---|---|---|---|
| 6,294,927 | B1 | 9/2001 | Yoeli et al. |
| 6,603,484 | B1* | 8/2003 | Frisken et al. ............... 345/622 |
| 6,777,977 | B1 | 8/2004 | Reynolds et al. |
| 6,873,182 | B2 | 3/2005 | Mohan et al. |
| 6,873,185 | B2* | 3/2005 | Cox ............................ 326/47 |
| 6,882,176 | B1 | 4/2005 | Norman et al. |
| 6,924,662 | B2 | 8/2005 | Amarilio et al. |
| 7,084,464 | B2* | 8/2006 | Zounes ....................... 257/368 |
| 7,149,996 | B1 | 12/2006 | Lysaght et al. |
| 7,461,234 | B2* | 12/2008 | Ray et al. ..................... 712/10 |
| 7,696,783 | B2 | 4/2010 | Krishnan |
| 7,729,898 | B1 | 6/2010 | Lytle |
| 7,928,764 | B2* | 4/2011 | Yu et al. ....................... 326/41 |
| 8,667,046 | B2 | 3/2014 | Brisk et al. |
| 2006/0109027 | A1 | 5/2006 | Veredas-Ramirez |
| 2013/0162292 | A1 | 6/2013 | Afshar et al. |

OTHER PUBLICATIONS

Y. Kukimoto, R. Brayton, and P. Sawkary. Delay-optimal technology mapping by DAG covering. In Proceedings of the 35th Design Automation Conference, pp. 348-351, San Francisco, California, Jun. 1998.

V. Manohararajah and S. Brown. Heuristics for area minimization in LUT-based FPGA technology mapping. IEEE Transactions on Computer-Aided Design of Integrated Circuits and Systems, 25(11):2331-2340, Nov. 2006.

J. Cong, C. Wu, and Y. Ding. Cut ranking and pruning: Enabling a general and efficient FPGA mapping solution. In Proceedings of the 7th ACM/SIGDA International Symposium on Field Programmable Gate Arrays, pp. 29-35, Monterey, Calif., Feb. 1999.

M. Schlag, J. Kong, and P. Chan. Routability-driven technology mapping for lookup table-based FPGAs. IEEE Transactions on Computer-Aided Design of Integrated Circuits and Systems, 13(1):13-26, Jan. 1994.

J. Luu, J. H. Anderson, and J. Rose. Architecture description and packing for logic blocks with hierarchy, modes and complex interconnect. In Proceedings of the 19th ACM/SIGDA International Symposium on Field Programmable Gate Arrays, pp. 227-236, Monterey, Calif., Feb. 2011.

H. Yang and D. F. Wong. Edge-map: Optimal performance driven technology mapping for iterative LUT based FPGA designs. In Proceedings of the International Conference on Computer Aided Design, pp. 150-155, San Jose, California, Nov. 1994.

D. Lewis et al. The Stratix Illogic and routing architecture. In Proceedings of the 13th ACM/SIGDA International Symposium on Field Programmable Gate Arrays, pp. 14-20, Monterey, California, Feb. 2005.

S. Yang. Logic synthesis and optimization benchmarks user guide, version 3.0, Technical report, Microelectronics Center of North Carolina, Research Triangle Park, N.C., Jan. 1991.

P. A. Jamieson and J. Rose. Enhancing the area efficiency of FPGAs with hard circuits using shadow clusters. IEEE Transactions on Very Large Scale Integration (VLSI) Systems, 18(12):1696-1709, Dec. 2010.

Chen, Shyh-Ching et al., Combinational Circuit Synthesis with Time and Component Bounds, IEEE Transactions on computers, Aug. 1977, pp. 712-726.

Preparata, F.P., et al., Reduction of Depth of Boolean Networks with a Fan-In Constraint, IEEE Transactions on Computers, vol. C-26, No. 5, May 1977.

Kuck, D.J., The Structure of Computers and Computations, Chapter 2, 1978, pp. 100-115.

* cited by examiner (a) AIC mapping (b) LUT mapping

| Algorithm – Finds the best cone for each node of the DAG |
| --- |
| 1:      $BestC_v.dp \leftarrow \infty$ |
| 2:      $BestC_v.af \leftarrow \infty$ |
| 3:      for $i = 1 \rightarrow nC_v(LUT)$ do |
| 4:          $v.setdp(C_v(i))$ |
| 5:          $v.setaf(C_v(i))$ |
| 6:          $cond_1 \leftarrow C_v(i).dp < BestC_v.dp$ |
| 7:          $cond_2 \leftarrow C_v(i).dp = BestC_v.dp$ |
| 8:          $cond_3 \leftarrow C_v(i).af < BestC_v.af$ |
| 9:          if $cond_1 \parallel (cond_2 \&\& cond_3)$ then |
| 10:              $BestC_v \leftarrow C_v(i)$ |
| 11:          end if |
| 12:      end for |
| 13:      for $i = 1 \rightarrow nC_v(AIC)$ do |
| 14:          $v.setdp(C_v(i))$ |
| 15:          $v.setaf(C_v(i))$ |
| 16:          $cond_1 \leftarrow C_v(i).dp < BestC_v.dp$ |
| 17:          $cond_2 \leftarrow C_v(i).dp = BestC_v.dp$ |
| 18:          $cond_3 \leftarrow C_v(i).af < BestC_v.af$ |
| 19:          if $cond_1 \parallel (cond_2 \&\& cond_3)$ then |
| 20:              $BestC_v \leftarrow C_v(i)$ |
| 21:          end if |
| 22:          $cond_1 \leftarrow C_v(i).dp < BestBackupC_v.dp$ |
| 23:          $cond_2 \leftarrow C_v(i).dp = BestBackupC_v.dp$ |
| 24:          $cond_3 \leftarrow C_v(i).af < BestBackupC_v.af$ |
| 25:          if $C_v(i).root = v$ then |
| 26:              if $cond_1 \parallel (cond_2 \&\& cond_3)$ then |
| 27:                  $BestBackupC_v \leftarrow C_v(i)$ |
| 28:              end if |
| 29:          end if |
| 30:      end for |

Fig. 6

PARTIALLY OVERLAPPING TREE STRUCTURE ARRANGEMENT

TREE STRUCTURE

NON-LUT FIELD-PROGRAMMABLE GATE ARRAYS

RELATED CASE INFORMATION

The present application is a Continuation-in-part of application Ser. No. 13/333,229, filed Dec. 21, 2011, entitled NON-LUT FIELD-PROGRAMMABLE GATE ARRAYS, the entirety of which is incorporated herein by reference.

FIELD

The disclosure generally relates to integrated circuits. More specifically, the disclosure relates to the implementation of logic in integrated circuits.

BACKGROUND

Field-Programmable Gate Arrays (FPGAs), generally include circuitry that can be configured to behave as different user-defined hardware designs. FPGAs in which K-input Look-Up Tables (LUTs) are used as elementary logic blocks have been used universally since the 1980s. In general, K-input LUTs are generic blocks which can implement particular logic functions of K-inputs. Particular circuitry may be mapped in an FPGA by covering the circuitry with K-input subgraphs, irrespective of the functionality that the circuitry represents.

However, increasing the number of LUT inputs to cover larger parts of a circuit has an exponential cost in the LUT complexity. The area of a LUT generally increases exponentially with the number of inputs to the LUT, which disadvantageously takes up substantial amounts of chip real estate. Also, disadvantageously, the delay introduced by a LUT grows linearly with the number of inputs to the LUT. Thus, LUTs with more than 4-6 inputs are rarely used. Further, because LUTs intrinsically have only one output, internal fan-out of subgraphs cannot be performed using LUTs to cover a particular circuitry.

Alternate FPGA structures have been proposed based on logic synthesis capabilities at various times. Such alternate FPGA structures have almost universally been based on addressed programmable AND/OR configurations in the form of small Programmable Array Logics (PALs) to implement sum of products representations and algebraic transformations, for example.

One proposed FPGA structure includes small PAL-like structures, with 7-10 inputs and 10-13 product terms, for example. Such structures have been found to obtain performance gains at the price of an increase in area. Another proposed FPGA structure includes K-input multiple-output PAL-style logic blocks. Such structures have been found to be more area efficient than 4-input LUTs but generally consume an unacceptable amount of static power.

Yet another proposed FPGA structure includes an "extended" logic element with slightly modified K-input LUTs to reduce the tile area needed for a logic block. In one example, the addition of an AND gate on the LUT output produces an extended K-LUT. Implementations of such an extended K-LUT on the area of a K-LUT have provided the performance of a K+1-LUT. Such increased performance could facilitate further advantages such as reduced wire lengths, reduced interconnect capacitance and reduced delay, for example, however disadvantages of LUT structures generally remain.

Reconfigurable logic blocks have been adapted for specific FPGA implementations by adding dedicated logic gates to existing LUTs. Various other application specific FPGA configurations have been proposed or implemented. However, such configurations that are specific to various fields or applications have not been practical for more general FPGA implementations.

SUMMARY

FPGAs according to the present disclosure are generally made of structures or logic blocks including circuitry such as AND-OR layers for implementing Boolean Sums-of-Products configurations. In an illustrative embodiment, logic blocks are disclosed herein that can replace the use of LUTs in an FPGA. The logic blocks disclosed herein can provide an improved compromise between hardware complexity, flexibility, delay, and input and output counts of an FPGA relative to a conventional FPGA.

In an illustrative embodiment, logic blocks are based on And-Inverter Graphs (AIGs) and include 2-input AND gates coupled to an optional inverter at the output. The logic blocks can have multiple independent outputs. This implementation may be used in combination with, for instance, Boolean Satisfiability (SAT) solvers. Once a circuit is written and optimized in the form of an AIG according to the present disclosure, many AIG subgraphs of various depths rooted at different nodes in the circuit can be found.

In the illustrative embodiment, the disclosed logic blocks have a complexity which only increases linearly with the number of inputs. Delay associated with the disclosed logic blocks increases only logarithmically with the number of inputs.

Aspects of the present disclosure provide effective mapping algorithms and a simplified logic block structure for constructing FPGAs. One or more LUTs can still be used in combination with the disclosed logic blocks in an FPGA.

In an illustrative embodiment, the disclosed logic block includes an AND-Inverter Cone structure (AIC). The disclosed AIC provides a reconfigurable circuit to which arbitrary AIGs can be naturally mapped. In the illustrative embodiment, an AIC includes a number of cells configured in a binary tree arrangement with a number of intermediary outputs. Each cell includes an AND gate selectably coupled to an inverter.

The disclosed AICs can provide improved input bandwidth and output bandwidth compared to LUTs, because the area of the AICs grows only linearly with the number of inputs and delay associated with an AIC grows only logarithmically with the input count. Because an AIC may include multiple outputs, intermediate outputs may be easily implemented which allows mapping circuits more efficiently than LUTs. Because the AICs are multi-output blocks, having higher input bandwidth than LUTs, they can cover more logic depth. This makes it possible for AICs to cover AIG nodes more efficiently.

In an illustrative embodiment, the AIC includes cells having an input and an output. Each of the cells is configurable or programmable as an AND gate or a NAND gate. The cells may include a programmable conditional inversion. Further, at least one of the cells may be configurable as a bypass.

In this illustrative embodiment, the cells are typically arranged in a tree structure, which may be a binary tree structure, having a number of levels, for example a top level, an intermediary level, and a bottom level. The input may include two inputs to each of the cells in the top level, and the output from the cells may include an intermediary output from the intermediary level and an output from the bottom level.

In an illustrative embodiment the AIC is a 3-AIC, wherein the tree structure includes three levels, a top level, one intermediary level, and a bottom level. The 3-AIC, includes seven cells, four in the top level, two in the intermediary level, and one in the bottom level. Thus, the 3-AIC may include eight inputs, two for each cell in the top level, and three outputs, two intermediary outputs from the intermediary level and one output from the bottom level.

In an illustrative embodiment the AIC is a 4-AIC, wherein the tree structure includes four levels, a top level, a first intermediary level, a second intermediary level, and a bottom level. The 4-AIC, includes fifteen cells, eight in the top level, four in the first intermediary level, two in the second intermediary level, and one in the bottom level. Thus, the 4-AIC may include sixteen inputs, two for each cell in the top level, and seven outputs, four first intermediary outputs from the first intermediary level, two second intermediary outputs from the second intermediary level, and one output from the bottom level.

In an illustrative embodiment the AIC is a 5-AIC, wherein the tree structure includes five levels, a top level, a first intermediary level, a second intermediary level, a third intermediary level, and a bottom level. The 5-AIC, includes thirty one cells, sixteen in the top level, eight in the first intermediary level, four in the second intermediary level, two in the third intermediary level, and one in the bottom level. Thus, the 5-AIC may include thirty two inputs, two for each cell in the top level, and fifteen outputs, eight first intermediary outputs from the first intermediary level, four second intermediary outputs from the second intermediary level, two third intermediary outputs from the third intermediary level, and one output from the bottom level.

In an illustrative embodiment the AIC is a 6-AIC, wherein the tree structure includes six levels, a top level, a first intermediary level, a second intermediary level, a third intermediary level, a fourth intermediary level, and a bottom level. The 6-AIC, includes sixty three cells, thirty two in the top level, sixteen in the first intermediary level, eight in the second intermediary level, four in the third intermediary level, two in the fourth intermediary level, and one in the bottom level. Thus, the 6-AIC may include sixty four inputs, two for each cell in the top level, and thirty one outputs, sixteen first intermediary outputs from the first intermediary level, eight second intermediary outputs from the second intermediary level, four third intermediary outputs from the third intermediary level, two fourth intermediary outputs from the fourth intermediary level, and one output from the bottom level.

In an illustrative embodiment one or more of the AICs or a combination of AICs, including a 2-AIC, 3-AIC, 4-AIC, 5-AIC, and 6-AIC, may be integrated into a programmable integrated circuit. For example, when integrated into a circuit one or more of the AICs may be in communication with one or more input crossbars, and output to one or more logic block crossbars. The logic block crossbars may then output to one or more multiplexers and/or one or more optional flip-flops. The flip-flips, when included, output to the multiplexers. The multiplexers may then communicate with an output crossbar.

BRIEF DESCRIPTION OF THE DRAWINGS

The systems, methods, and apparatuses disclosed herein are illustrated in the figures of the accompanying drawings which are meant to be exemplary and not limiting, in which like references are intended to refer to like or corresponding parts, and in which:

FIG. 6 illustrates an example algorithm presenting pseudo-code of a best cone finder;

DETAILED DESCRIPTION

Detailed embodiments of systems, methods, and apparatuses that relate to the implementation of logic in integrated circuits are disclosed herein, however, it is to be understood that the disclosed embodiments are merely exemplary of the systems, methods, and apparatuses disclosed herein, which may be embodied in various forms. Therefore, specific functional details disclosed herein are not to be interpreted as limiting, but merely as a basis for the claims and as a representative basis for teaching one skilled in the art to variously employ the systems, methods, and apparatuses disclosed herein.

In an illustrative embodiment, new logic blocks, AND-Inverter Cones (AICs), are disclosed herein. In one embodiment, an AIC is a binary tree composed of AND gates with one or more programmable conditional inversions and a number of intermediary outputs. The AICs may be used as the sole logic components of integrated circuits, such as programmable integrated circuits and Field-Programmable Gate Array (FPGAs). The AIC(s) attempts to reduce the degree of generality provided by typical LUTs in order to obtain faster mappings. Unlike Look-Up tables (LUTs), the AIC may not implement all possible functions of its inputs. However, the AIC can provide a better compromise between hardware complexity, flexibility, delay, and input and output counts. Further, one or more LUTs can still be used in combination with the disclosed logic blocks in an FPGA.

In an illustrative embodiment, an And-Inverter Graph (AIG) is a directed acyclic graph (DAG), in which the logic nodes are two-input AND gates and the edges can be complemented to represent inverters at the node outputs. AIGs are advantageous for combinational logic synthesis and optimization. This graph representation format may also be used for technology mapping steps in both FPGA and application-specific integrated circuit (ASIC) designs.

AIGs in the illustrative embodiment include various cone-like subgraphs rooted at each node with different depths. Usually, the subgraphs with lower depths are more symmetric and resemble full binary trees. The frequent occurrence of such conic subgraphs serves as a basis for the implementation of the AICs that can map cones with different depths more efficiently than LUTs. The basic principle is to have a symmetric and conic block with depth D, which maps arbitrary AIG subgraphs with depth D.

Figure 1:
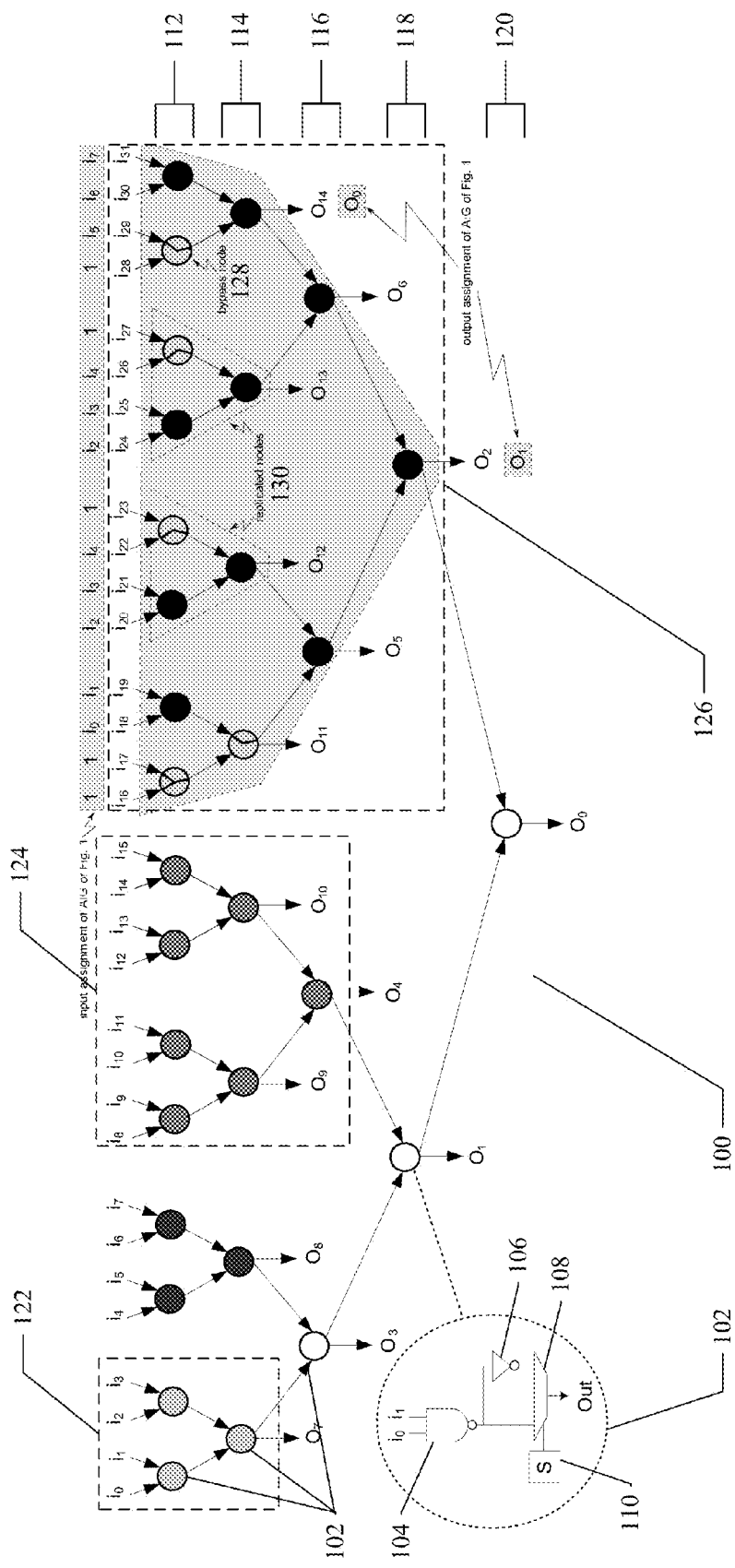
FIG. 1 illustrates an architecture of an AIC having a depth of five or five levels of cells.

An architecture of an AND-Inverter Cone (AIC) 100 having a depth of five or five levels of cells according to an illustrative embodiment is described with reference to FIG. 1. As illustrated in FIG. 1, the AIC having a depth of five (a 5-AIC) 100 may include thirty one (31) cells, for example, illustrated as 102. Each cell 102, can be configured as either a two-input NAND or AND gate. For example, in an illustrative embodiment, each cell 102 may include a NAND gate 104 coupled to an inverter 106. Additionally, the NAND gate 104 and the inverter 106 may be coupled to a multiplexer (MUX) 108 configured to receive a select signal 110 for enabling or disabling the inverter 106.

As illustrated in FIG. 1, there are sixteen cells 102 in a top or lowest level 112, eight cells 102 in a first intermediary level 114, four cells 102 in a second intermediary level 116, two cells 102 in a third intermediary level 118, and one cell 102 in a bottom level 120. Thus, the 5-AIC 100 may include thirty two inputs, (i0-i31), two for each cell 102 in the top level 112.

Further, as illustrated, except for the cells 102 at a lowest or top level 112, of the AIC 100, each cell 102 at levels 114, 116, 118, and 120 has an output, O0-O14. Thus, the 5-AIC 100 includes fifteen outputs (O0-O14), eight first intermediary outputs (O7-O14) from the first intermediary level 114, four second intermediary outputs (O3-O6) from the second intermediary level 116, two third intermediary outputs (O1 and O2) from the third intermediary level 118, and one output (O0) from the bottom level 120. This provides access to intermediate nodes. Moreover, these outputs enable a larger AIC to be configured as multiple smaller AICs. For example, a 2-AIC, illustrated as 122, includes two levels, a top level and a bottom level. The 2-AIC 122, includes three cells, two cells in the top level and one cell in the bottom level. Thus, the 2-AIC 122 may include four inputs, for example, i0-i3, and one output, for example O7 from the bottom level.

A 3-AIC, illustrated as 124, includes three levels, a top level, one intermediary level, and a bottom level. The 3-AIC 124, includes seven cells, four cells in the top level, two cells in the intermediary level, and one cell in the bottom level. Thus, the 3-AIC 124 may include eight inputs, for example, i8-i15, and three outputs, for example, O4, O9, and O10. The outputs include two intermediary outputs from the intermediary level, for example, O9 and O10, and one output from the bottom level, for example, O4.

A 4-AIC, illustrated as 126, includes four levels, a top level, a first intermediary level, a second intermediary level, and a bottom level. The 4-AIC 126, includes fifteen cells, eight cells in the top level, four cells in the first intermediary level, two cells in the second intermediary level, and one cell in the bottom level. Thus, the 4-AIC 126 may include sixteen inputs, for example, i16-i31, and seven outputs, for example, O2, O5, O6, and O11-O14. The outputs include four first intermediary outputs from the first intermediary level, for example, O11-O14, two second intermediary outputs from the second intermediary level, for example, O5 and O6, and one output from the bottom level, for example, O2.

Accordingly, a 5-AIC contains two 4-AICs, four 3-AICs and eight 2-AICs. As illustrated in FIG. 1, values can be propagated by configuring a node as a bypass 128, for example, forcing one input to 1 when this is operated as an AND. Moreover, some nodes may be replicated, illustrated as 130, when the fanout of an internal value is higher than one.

Generalizing, each D-AIC, has 2D-1 cells, 2D inputs and 2D-2D-1 outputs. For example, a 6-AIC, includes six levels, a top level, a first intermediary level, a second intermediary level, a third intermediary level, a fourth intermediary level, and a bottom level. The 6-AIC, includes sixty three cells, thirty two cells in the top level, sixteen cells in the first intermediary level, eight cells in the second intermediary level, four cells in the third intermediary level, two cells in the fourth intermediary level, and one cell in the bottom level. Thus, the 6-AIC may include sixty four inputs, two for each cell in the top level, and thirty one outputs, sixteen first intermediary outputs from the first intermediary level, eight second intermediary outputs from the second intermediary level, four third intermediary outputs from the third intermediary level, two fourth intermediary outputs from the fourth intermediary level, and one output from the bottom level.

Below, the effect of the allowed AIC depth on the mapping solution is described in relation to D-AICs with depths between two and six. Although, depths of six (6) and below are described herein, it should be appreciated that depth greater than six (6) may be constructed. Table 1, illustrated below, compares different D-AICs with the conventional 6-LUT in terms of input/output (I/O) bandwidth, number of configuration bits, and multiplexers (MUX). As illustrated in Table 1, AICs have a lower number of configuration bits than LUTs, while AICs can implement circuits that have a much higher number of inputs.

TABLE 1

Comparison of different D-AICs with the conventional 6-LUT in terms of I/O bandwidth, number of configuration bits, and MUX.

| Block | Inputs | Outputs | MUX | Config. Bits |
|---|---|---|---|---|
| 2-AIC | 4 | 1 | 3 | 3 |
| 3-AIC | 8 | 3 | 7 | 7 |
| 4-AIC | 16 | 7 | 15 | 15 |
| 5-AIC | 32 | 15 | 31 | 31 |
| 6-AIC | 64 | 31 | 63 | 63 |
| 6-LUT | 6 | 1 | 64 | 64 |

In an illustrative embodiment, during technology mapping, the nodes comprising the AIG are clustered into subgraphs that can be mapped onto an AIC or a LUT. This can be done in multiple ways depending on the optimization objectives.

As described herein, the optimization objectives of technology mapping are delay minimization and area reduction. In an illustrative embodiment, delay minimization is the primary optimization objective and area reduction is the secondary optimization objective. In this illustrative embodiment, a mapping solution may be said to be optimal if the mapping delay is minimum. In another illustrative embodiment, area reduction is the primary optimization objective and delay minimization is the secondary optimization objective. In this illustrative embodiment, a mapping solution may be said to be optimal if the area is minimum. The technology mapping for AICs is similar to the typical LUT technology mapping but adapted to the peculiarities of AICs, such as the fact that multiple outputs are possible. Below, the steps of the mapping algorithm are described in detail.

In an illustrative embodiment, a technology independent synthesized netlist (AIG format) is input to a mapping heuristic. Such a netlist can be automatically produced by known synthesis tools such as ABC available from Berkeley Logic Synthesis and Verification Group of Berkeley, Calif., for example. The input netlist is used to extract the combinational parts of the circuit and represent the combinational parts by a DAG G=(V(G),E(G)). For sequential circuits, flip-flops are cut to obtain the combinational sub-circuits, which are represented by the DAG. A node v∈V(G) can represent an AND gate, a primary input (PI), a pseudo input (PSI, output of a flip-flop), primary output (PO) or pseudo output (PSO, input of a flip-flop). A directed edge e∈E(G) represents an interconnection wire in the input netlist. The edge can have the complemented attribute to represent the inversion of the signal.

At a node v, the depth, depth(v), denotes the length of the longest path from any of the PIs or PSIs to the v. The height, height(v), denotes the length of the longest path from v to any of the POs or PSOs. Accordingly, the depth of a PI or PSI node and the height of a PO or PSO node are zero.

The mapping algorithm used herein is a modified version of the classical depth optimal LUT mapping algorithm. However, it should be appreciated by those skilled in the art that other mapping algorithms may be used. Further, it should be appreciated by those skilled in the art that the problem of minimizing the depth can be solved optimally in polynomial time using dynamic programming. However, area-minimization is also targeted as an objective, which is known to be NP-hard for LUTs of size three and greater. An area flow heuristic may be used for area approximation during the mapping.

The mapping of a graph in LUTs requires different considerations. For a node v, there exists several subgraphs containing v as the root, which are called cones. Accordingly, Cv is a cone that includes node v in its root and some of (all) its predecessors that have a path to v. For mapping Cv by a LUT, it should be K-feasible, where inputs(Cv)≤K. Moreover, the cone should be fanout-free, meaning that the only path out of Cv is through v. If the cone is not fanout-free, then the node which provides the fanout may be duplicated and will be mapped by other LUT(s), as depth minimization is one objective.

The AICs mapping cone candidates of v are extracted differently. In this case, rather than being K-feasible, a cone Cv, to be mappable on a D-AIC block, should be depth feasible, where depth(Cv)≤D. The other constraint is that the nodes at lowest depth of Cv, should not have any path to a node outside Cv, otherwise such nodes are removed from Cv. This later condition ensures Cv to be mappable to the D-AIC of FIG. 3, in which no output is permitted for the nodes at the lowest level of the AIC.

When AICs are considered as the mapping target in addition to LUTs, the definition of the mapping for depth problem does not change. The only difference is that the cone candidates of AICs are added to the cone candidates of LUTs for each node in the graph. Although the conditions of eligibility for LUTs and AICs are different, it is possible to have common cones between the two that are treated as separate candidates. The main steps of the mapping algorithm are described below in detail. The cones of a node may be computed by combining the cones of the input nodes in every possible way. This step of the mapping takes a significant portion of the total execution time, especially when K is a large value such as six.

The cone generation for AICs is different from the cone generation for LUTs, as the cones of each node are produced independent of the cones of its input nodes. To generate all possible D-AIC mappable cones for a node v, the subgraphs rooted at v are examined by varying the cone depth from two to D. All possible subgraphs that meet the AIC mapping conditions, described above, are added to the cone set of node v. If a cone Cv satisfies the depth condition, but has a fanout node u at the lowest depth of the cone, u will be removed from Cv and if this still satisfies the depth condition, the cone will be added to the D-AIC mappable cone set.

Figure 2:
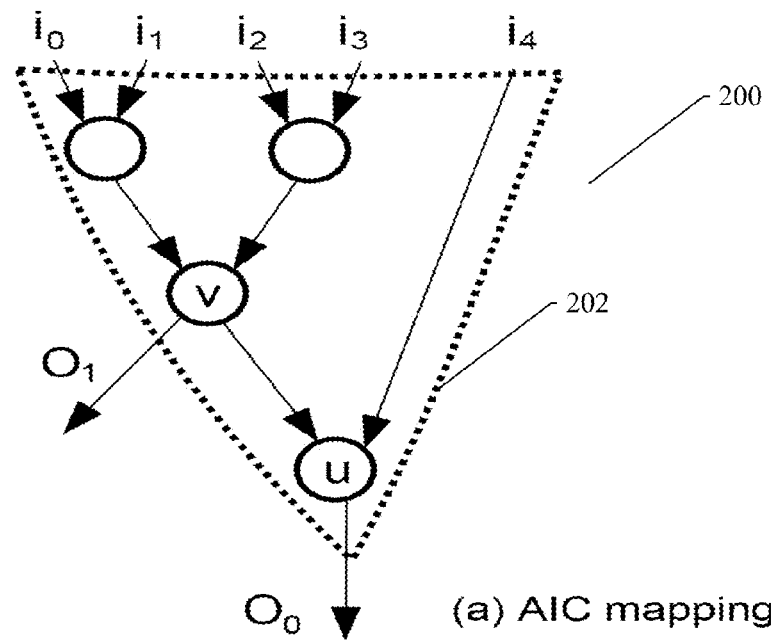
FIG. 2 illustrates an example of cone generation for AIC mapping.
Figure 3:
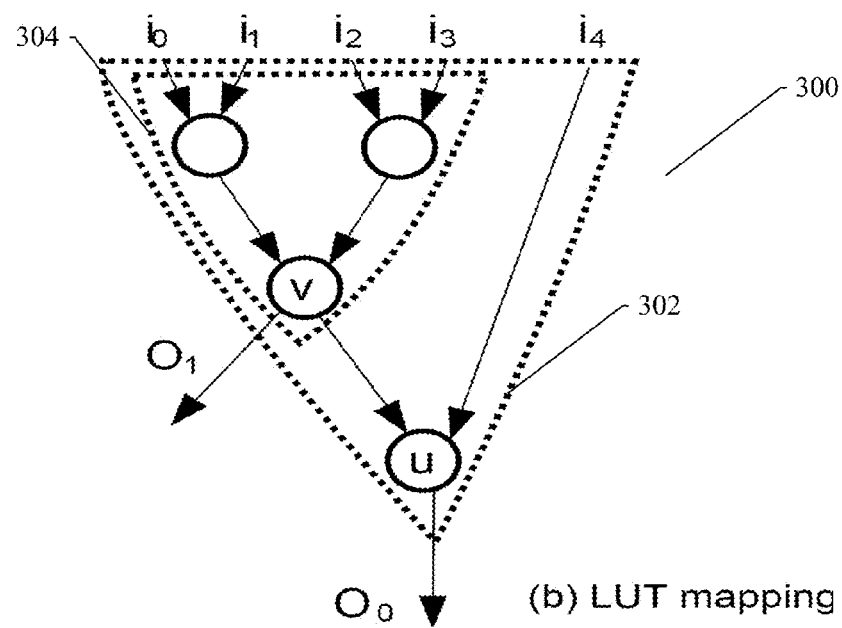
FIG. 3 illustrates an example of cone generation for LUT mapping.

The main difference between the cone generation for AICs and LUTs is having common cone candidates for different nodes, as illustrated in FIGS. 2 and 3. FIG. 2 illustrates an AIC mapping 200, and FIG. 3 illustrates a LUT mapping 300. As illustrated in FIG. 2, the AIC has multiple outputs, O0 and O1. Thus, a cone 202 that has u as its root, can be used to map v as well as u. Therefore, the cone 202 should be in the AIC cone sets of both v and u. The cone 202 is referred to as a free cone for node v, as the cone 202 maps v for free when it is selected for u mapping. In contrast, as illustrated in FIG. 3, in LUT mapping, no common cone exists for any two nodes. For example, the cone 302 has u as its root, and the cone 304 has v as its root. Thus, in LUT mapping, the cone 302 that has u as its root, cannot be used to map v.

Figure 4:
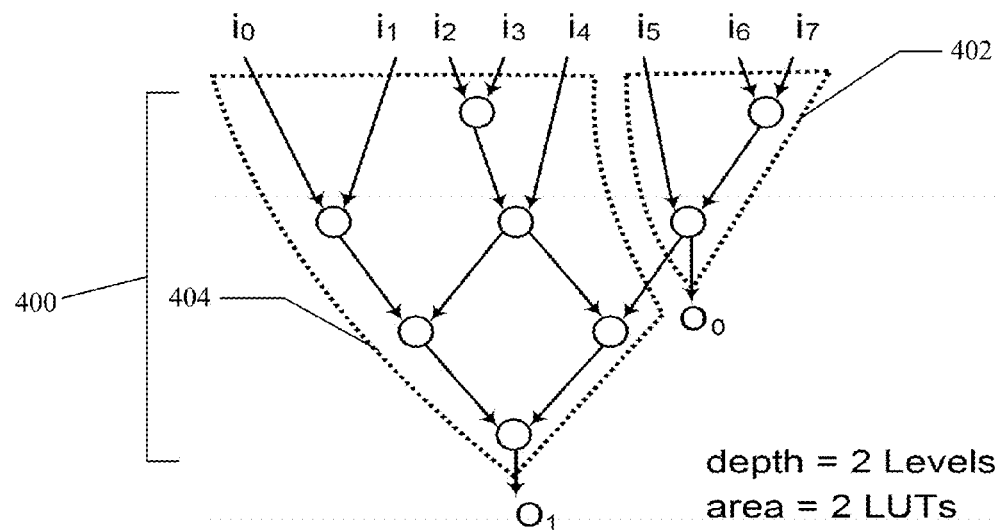
FIG. 4 illustrates a LUTs mapping of an AIG.
Figure 5:
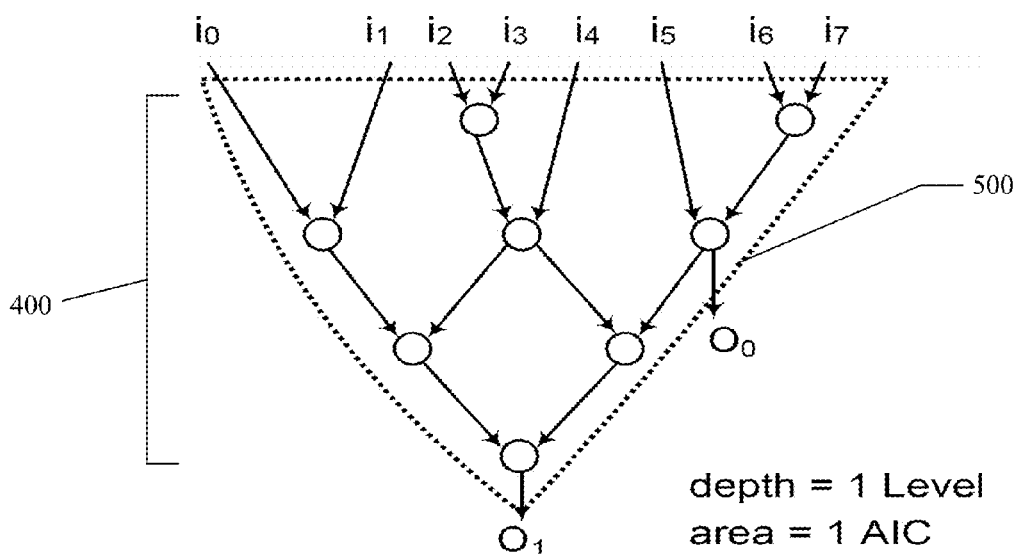
FIG. 5 illustrates an AIC mapping of the AIG of FIG. 4.

The potential benefits of AICs with respect to LUTs is illustrated in FIGS. 4 and 5. FIGS. 4 and 5 illustrate an AIG circuit functionality 400 having eight (8) inputs, i0-i7, and two (2) outputs, O0-O1. As illustrated in FIG. 4, two levels of LUTs, a first LUT 402 and a second LUT 404, are required to map the AIG 400. In contrast, as illustrated in FIG. 5, the same AIG 400 can be mapped onto a single AIC 500. The reason for that is two-fold: (1) on the one hand, the LUT size is limited to six inputs and the entire AIG 400, which includes eight inputs, can not fit into a single 6-LUT; and (2) on the other hand, even if the size of the LUT was big enough, the mapping would still use two LUTs, as the AIG 400 has two distinct outputs. Further, increasing the LUT size to accommodate more inputs would result in a large area overhead. Instead, the AIC offers a smaller area and propagation delay than a LUT for the same number of inputs. For example, a 4-AIC with sixteen (16) inputs requires half of the area of a 6-input LUT with less delay. The fact that more wires need to be connected to the AICs arise new routing congestion issues. However, as described below, these routing congestion issues can largely be alleviated by packing several AICs in a limited bandwidth AIC cluster with local interconnect.

In an illustrative embodiment, the time complexity of the D-AIC cone generation is O(M×D), where M is the number of nodes in the graph and D is the maximum depth of a AIC block.

In an illustrative embodiment, once the cone sets of both LUTs and AICs for every node in the graph are obtained or determined, the next step is to find the best cone of each node. Since one objective is to minimize the depth, the best cone of node v is the one that gives v the lowest depth. If there is more than one option, the cone which brings less area flow to v is selected. The depth and area flow of v, when mapped onto cone Cv, are dependent on the depth and area flow values of the Cv input nodes. Since the nodes in the graph are visited in topological order, it is ensured that the depth and area flow values of the predecessor nodes of v have been determined before v is visited. For PIs and PSIs, the depth and area flow values are initialized to zero.

In an illustrative embodiment, the following equations describe the computation of depth, dp(v), and area flow, af(v), of node v. The FPGA blocks, including K-LUTs and D-AICs are heterogeneous and have different depths. Thus, the interconnection wire delays for the depth computation of each node should be considered similar to the edge-delay model. Although there are both local (intra cluster) and global (inter cluster) routing wires, which have different delays, for purposes of this computation it is assumed that all wires have an equal delay, which is the average delay of the local and global routing wires.

$$dp(v) = \max(dp(In(C_v)) + dp(C_v) + dp(\text{wire})) \quad (1)$$

$$af(v) = \sum_{i=0}^{nIn(C_v)} af(In_i(C_v)) + \text{area}(C_v) \quad (2)$$

$dp(C_v)$ and $\text{area}(C_v)$ in the above equations are the depth and area of the logic block that Cv can be mapped on, respectively. This block can be either a K-LUT or a D-AIC. If Cv is a free cone of node v, then dp(Cv) and dp(In(Cv)) will refer to the depth and inputs of the sub-AIC in Cv, respectively. For area flow computation, the term area(Cv) will be removed from Equation 2.

FIG. 6 illustrates an algorithm that presents pseudo-code of the best cone finder. The algorithm, illustrated in FIG. 6, iterates over all generated cones for both LUTs and AICs in node v. The depth and area flow of v is determined for each cone Cv and then the depth is compared with the depth of v in the best cones that have been explored so far. If the current depth is lower or if the current depth is equal and the current area flow is lower, then the current cone is selected as the best cone. This process is repeated for all cones of v.

If the best cone of node v is a free cone, the cone will be selected for the mapping if and only if the cone root, which is not v, is visible in the final mapping solution and this cone is the best cone of the root node as well. If one of these two conditions does not hold, then another cone is selected as the best cone for node v. Therefore, a non-free best cone should be maintained, which has v as its root, for node v as a backup best cone.

In an illustrative embodiment, once the best cones for LUTs and AICs are obtained or determined, the graph is covered by the best cones of the visible nodes in the graph, which are added to a mapping solution set S. A node is referred to as visible, if the node is an output or input node of a selected cone in the final mapping. Initially POs and PSOs are the only visible nodes and S is empty. The graph traversal is performed in the reverse topological order from POs and PSOs to PIs and PSIs. If the visited node v is visible, then its best cone, BCv, is selected for the mapping and is added to S. Then, all the input nodes of BCv are marked as visible and the graph traversal continues. If the BCv is a free cone and it is already in S, there is no need to add it again and only the heights of the input nodes of v are updated. Otherwise, if the free cone is not in S, then the backup BCv, which has v as its root, is selected for the mapping and is added to S. During the backward traversal, the height of each visible node is updated. The initial heights of all nodes are zero. Once a BCv is selected for the mapping, the height of its input nodes are updated by adding the height of v to the depth of v within the target AIC.

The mapping solution resulting from the reverse graph traversal includes all of the cones that cover the graph. In an illustrative embodiment, once all of the cones that cover the graph are obtained or determined, each of the cones are mapped to either a K-LUT or a D-AIC. If the selected cone belongs to a K-feasible cone set of node v, then the cone has to be implemented by a LUT. Otherwise the cone is a D-AIC mappable cone, which is implemented by an AIC. The depth of the cone defines the type of the target AIC block.

In an illustrative embodiment, the proposed AICs may require a much higher I/O bandwidth than typical LUTs. In order to alleviate the routing problem that may result from that increase, multiple AICs can be grouped together into an AIC cluster with one or more local interconnects.

In an illustrative embodiment, a 6-AIC may be selected as the logic block to form an AIC cluster. The 6-AIC block covers all sub-AICs in Table 1. The AIC cluster includes N 6-AICs, optional flip-flops at the outputs of the N 6-AICs to support sequential circuits, and an input and an output crossbar. The AICs of the cluster are interconnected through the input crossbar. The input crossbar takes the cluster inputs as well as the outputs of the AICs in the cluster and routes these signals to the inputs of the AICs in the cluster. Such a crossbar is a circuit including multiplexers, which can be configured to route any input to any output of the crossbar. The input crossbar can also be depopulated to reduce the area of the input crossbar and in this case, some of the inputs may be routed to some of the outputs of the input crossbar.

In an illustrative embodiment, the input crossbar routes the cluster inputs and the outputs of N 6-AICs to the input of N 6-AICs and the output crossbar routes the outputs of N 6-AICs to the cluster outputs. In an illustrative embodiment, the same bandwidth of LUT-based clusters can be used for AIC clusters, and the AIC cluster area can be kept close to the area of the reference LUT cluster, which is the Logic Array Block (LAB) in the Altera Stratix-III available from Altera Corporation of San Jose, Calif., to avoid changing the inter-cluster routing of the FPGAs.

The two crossbars in the AIC cluster, are the main contributors to the cluster area. Crossbars are basically constructed by multiplexers and their area depends on their density and the number of the crossbar inputs and outputs. Since both crossbars obtain the outputs of N 6-AICs as the input, reducing the number of the 6-AIC outputs can significantly reduce the area share of the crossbars. Originally, each 6-AIC has 31 outputs. However, it has been observed that in the worst case 16 outputs are generally utilized and this happens when a 6-AIC is configured to 16 2-AICs. Thus, in one illustrative embodiment, a very simple sparse crossbar can be added at the output of each 6-AIC to reduce the number of 6-AIC outputs to 16.

Figure 7:
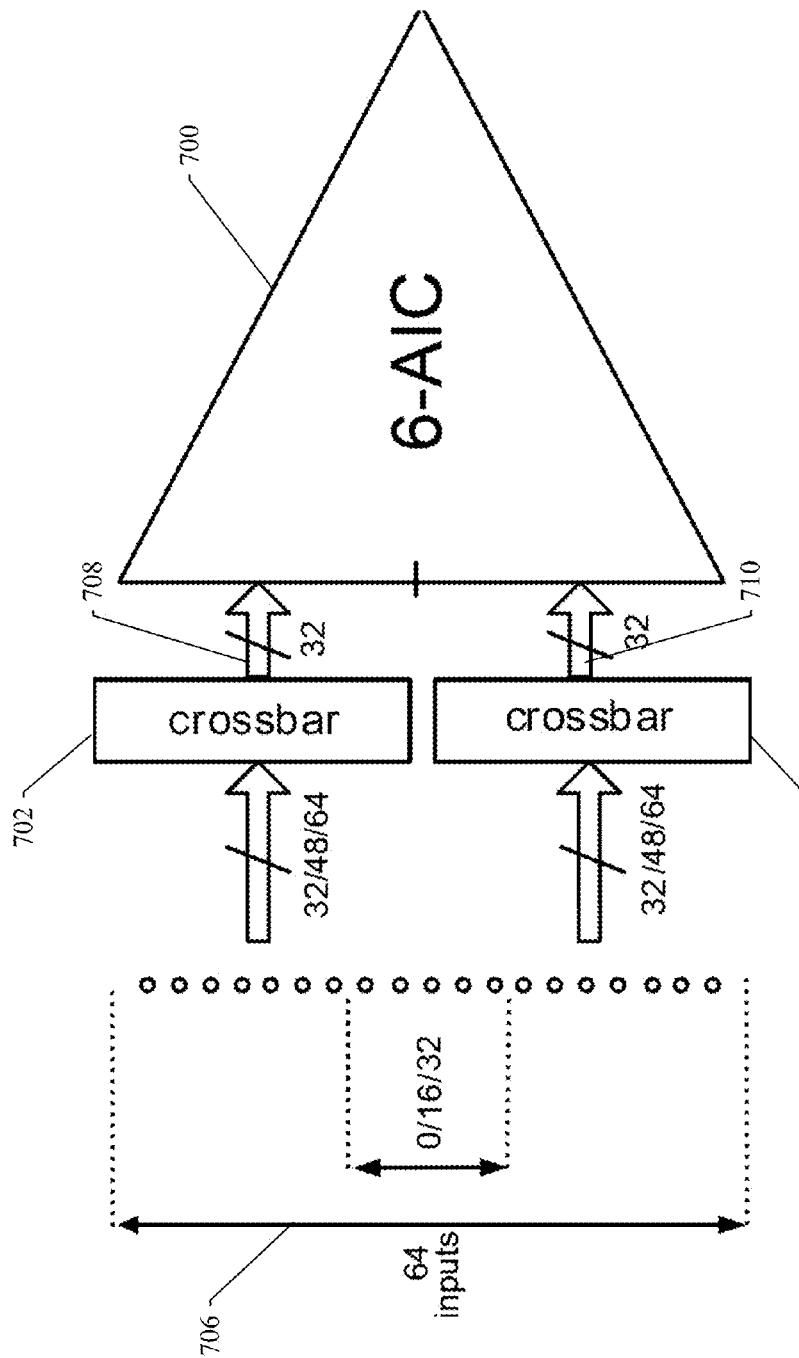
FIG. 7 illustrates an embodiment of different scenarios of the input crossbar in an AIC cluster comprising of 6-AIC(s)

In another illustrative embodiment, the crossbar area may be reduced by decreasing the connectivity of the crossbar and making the crossbar sparse. To trade-off the crossbar density and packing efficiency in the AIC cluster, the connectivity of the input crossbar of the cluster was varied from 50%, 75% and 100% connectivity, as illustrated in FIG. 7. As illustrated in FIG. 7, a 6-AIC 700 includes two crossbars at its inputs, a first crossbar 702 and a second crossbar 704. Each of the first crossbar 702 and the second crossbar 704 routes the cluster inputs to half of the 6-AICs inputs. As illustrated, the 64 cluster inputs 706 are divided into two sets of 32 inputs, a first set of 32 inputs 708 and a second set of 32 inputs 710 with 0/16/32 shared inputs between the two sets for a 32×32 (50%) connectivity, a 48×32 (75%) connectivity, and a 64×32 (100%) connectivity scenario, respectively. In this illustrative embodiment, each of the crossbars also route the AICs outputs to the AICs inputs, not shown in FIG. 7 for the sake of clarity.

The packing efficiency is the ratio of number of AIC clusters, assuming that the AIC cluster has unlimited bandwidth, and the actual number of AIC clusters that are obtained from the packing. To calculate the number of clusters in the ideal packing, Equation 3, presented below, is used. In Equation 3, nCi is the number of cones with depth i. The reported efficiency is the average packing efficiency of the 20 biggest MCNC benchmarks. In this illustrative embodiment, the allowed cone depth for the AIC cones in the technology mapping is varied from six to two. For each depth value, only cones with smaller or equal depth are considered for the mapping. Note that, for all of the experiments, the 6-AIC is used for the packing.

$$nClusters_{ideal} = \sum_{i=2}^{6}\left(\frac{nC_i}{N \cdot 2^{6-i}}\right) \quad (3)$$

The packing efficiency is reduced for all three scenarios substantially when the allowed cone depth in the technology mapping is reduced. This is reasonable, as the probability of inputs sharing and having open inputs is decreased for smaller cones. Moreover, when smaller AICs are packed to a 6-AIC, a larger number of the 6-AIC outputs are utilized and this increases the output bandwidth. Additionally, when the 48×32 crossbar is used, the packing efficiency is quite close to the packing efficiency of the 64×32 full crossbar. However, the packing efficiency for the 32×32 crossbar decreases to a larger extent. Therefore, one option to reduce the crossbar area without having a sensible degradation in packing efficiency is to set the crossbar connectivity to 75% (the 48×32 scenario).

Exploiting the crossbar simplifications, to keep the area of the AIC cluster close to the area of a LUT cluster (LAB), three 6-AICs can be in a cluster. The area model used and the area estimation of each component in the AIC cluster is detailed below.

As described above the architecture of AIC cluster is defined. In an illustrative embodiment, having the AIC cluster and also the LUT cluster (LAB), the technology mapped netlist can be taken and packed onto the above mentioned clusters. For the packing, the AAPack tool, for example, can be used, which is an architecture-aware packing tool developed for FPGAs. The AAPack tool is a packing tool developed at the University of Toronto, in Toronto, ON, Canada. The AAPack tool is integrated into another tool called Versatile Place and Route, see http://www.eecg.utoronto.ca/vtr/.

The input to the AAPack is the technology mapped netlist with unpacked blocks, as well as a description of an FPGA architecture. The output is a netlist of packed complex blocks that is functionally equivalent to the input netlist. Note that, AAPack may also be used to pack LUTs in LABs.

In this illustrative embodiment, the packing algorithm uses an affinity metric to optimize the packing This affinity metric defines the amount of net sharing between p, which is a packing candidate, and B, which is a partially filled complex block. In the architecture file, the complex block should be represented as an ordered tree. Nodes in the tree correspond to physical blocks or modes. The root of the tree corresponds to an entire complex block and the leaf nodes correspond to the primitives within the complex block. For the 6-AIC complex block, a tree is constructed, by which different configuration modes of the 6-AIC are defined.

Also, in the architecture file, the number of AICs in the cluster is defined, as well as the crossbars structure. This information is used by the packer to group the individual blocks in clusters. During the packing process, some routability checking may be performed to ensure (both local and global) routability of the packing solution, considering the intra block and the general FPGA interconnect resources.

As mentioned above, the area model is based on the transistor area in units of minimum-width transistor area; the rationale is that to a large extent the total area is determined by the transistors more than by the metal connections. For the delay model, circuits are modeled using SPICE simulations, as known in the art, for a 90-nm CMOS process technology.

Figure 8:
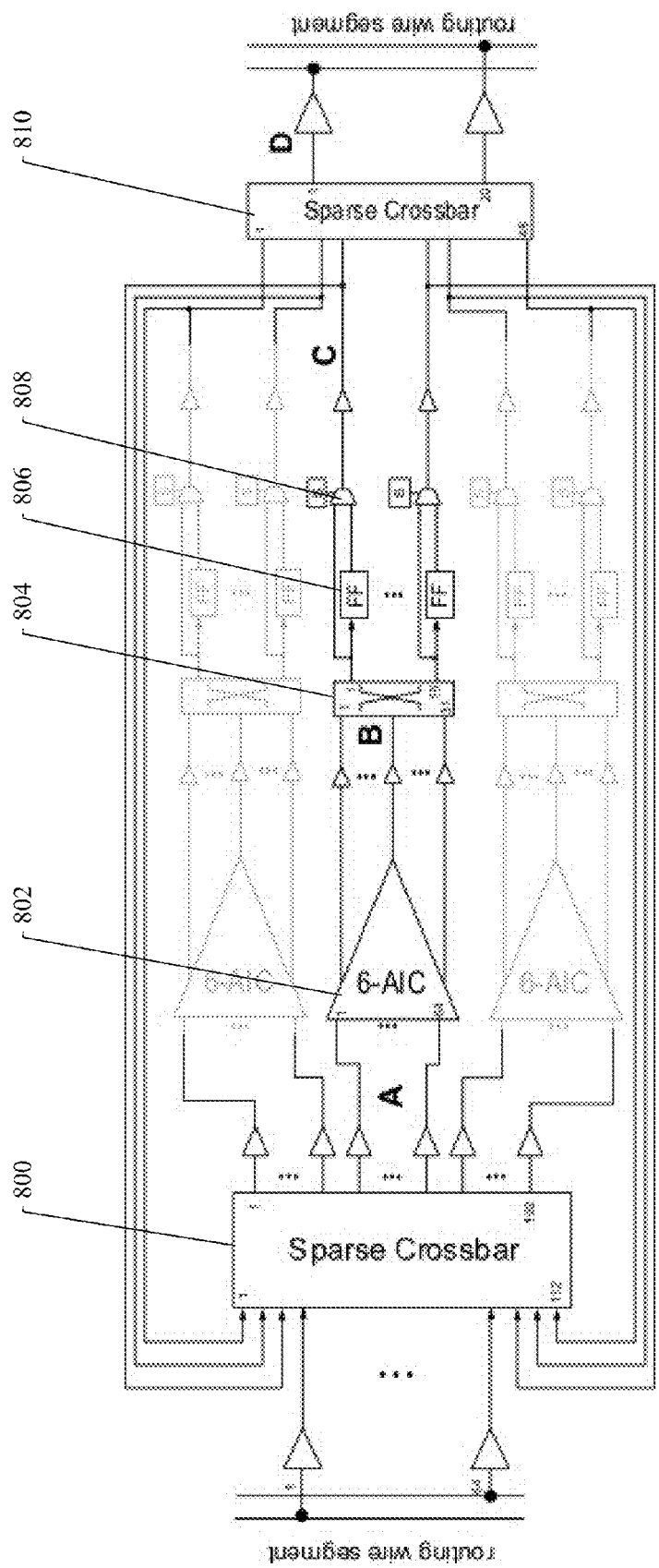
FIG. 8 illustrates an embodiment of an AIC cluster including three 6-AICs.

The area modeling method generally requires a detailed transistor-level circuit design of all the circuitry in the FPGA. FIG. 8, illustrates a structure and delay paths of an AIC cluster including three 6-AIC blocks. As illustrated in FIG. 8, the circuit diagram includes a cluster input crossbar 800, a 6-AIC block 802 in communication with the cluster input crossbar 800, an AIC output crossbar 804 in communication with the 6-AIC blocks 802, flip-flops (FFs) 806 in communication with the AIC output crossbar 804, multiplexers (MUXs) 808 in communication with the AIC output crossbar 804 and the FFs 806, and a cluster output crossbar 810 in communication with the MUXs 808. In general, an input of the 6-AIC block 802 communicates with an output of the cluster input crossbar 800. An input of the AIC output crossbar 804 communicates with an output of the 6-AIC block 802. An input of the FFs 806 communicates with an output of the AIC output crossbar 804. An input of the MUXs 808 communicates with the output of the AIC output crossbar 804 and an output of the FFs 806. An input of the cluster output crossbar 810 communicates with an output of the MUXs 808.

In an illustrative embodiment, the detailed transistor-level circuit design for the AIC cluster illustrated in FIG. 8, was determined, approximately sizing the transistors where appropriate. Table 2, illustrated below, lists the area of different components in the AIC cluster and in a LAB in terms of number of minimum-width transistors. Note that, in Table 2, ALM stands for Adaptive Logic Module which is the logic block in Altera Stratix-II and Stratix-III available from Altera Corporation of San Jose, Calif., and other Altera Stratix products. Based on Table 2, the area of an AIC cluster with three 6-AICs and the crossbars described above is slightly more than the area of a LAB with 10 ALMs.

TABLE 2

Areas of different components in an AIC cluster and in a LAB, measured in units of minimum-width transistor area.

| Component | Area ($Tr_{minW}$) |
|---|---|
| 6-AIC block (902) | 1,512 |
| 6-AIC output crossbar (904) | 1,088 |
| 6-AIC FFs (906) and MUXs (908) | 1,104 |
| AIC cluster input crossbar (900) | 21,888 |
| AIC cluster out crossbar (910) | 2,660 |
| AIC cluster buffers | 1,447 |
| AIC cluster with three 6-AICs | 37,137 |
| ALM | 1,751 |
| LAB in crossbar | 15,702 |
| LAB buffers | 470 |
| LAB with ten ALMs | 33,682 |

The circuit level design of the AIC cluster illustrated in FIG. 8 may also be used for modeling the cluster delays. The crossbars illustrated in FIG. 8 are developed using multiplexers, and for these a two level hybrid multiplexer was adopted, for example as used in Stratix-II. In this illustrative embodiment, the critical path of each crossbar goes through two pass gates, with buffers on the inputs and outputs of the components that include pass transistors.

In an illustrative embodiment, a SPICE simulation with a 90 nm 1.2-V CMOS process can be performed, to determine the delay of all paths in the cluster illustrated in FIG. 8. As illustrated in FIG. 8, points A, B, C, and D are identified. A path from point A to point B includes the 6-AIC 802 main output. A path from point B to point C includes the AIC output crossbar 804, FFs 806, and MUXs 808. A path from point C to point D includes the cluster output crossbar 810. The results of the simulation are listed in Table 3, illustrated below. For the path between point B and point C, the delay number relates to the path that goes through the main output of the 6-AIC, which has the longest path. These delay numbers are used in the technology mapping to minimize the delay of the mapped circuit.

TABLE 3

Figure 9:
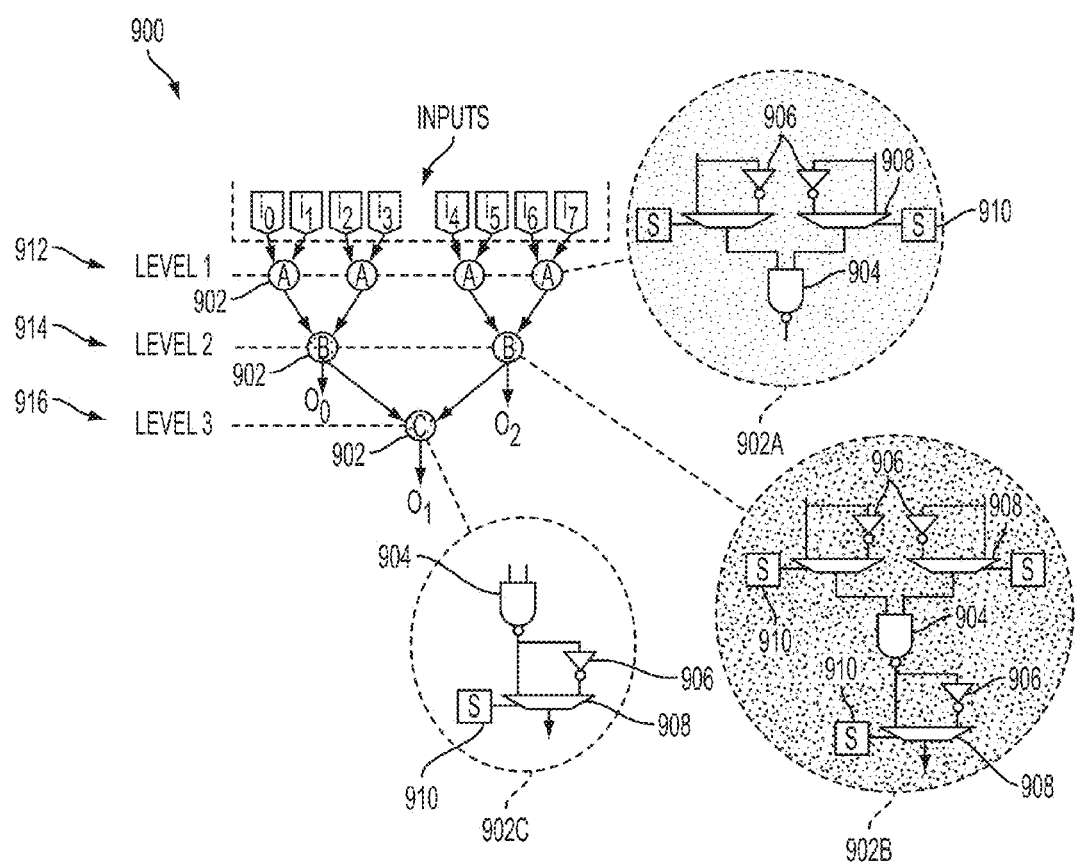
FIG. 9 illustrates a logic block having a depth of three or three levels of cells.

Delays of different paths in the AIC cluster illustrated in FIG. 9.

| Path | Description | Delay (ps) |
| --- | --- | --- |
| A → B | 6-AIC (902) main output | 496 |
| B → C | Crossbar (904), FFs (906), and MUXs (908) | 75 |
| C → D | Output crossbar of cluster (910) | 50 |

In an illustrative embodiment, the delay of a LAB may also be measured by performing a SPICE simulation. The simulation results revealed that the delay of a 6-LUT in an ALM, excluding the LAB input crossbar, in a 90 nm CMOS process, is between 280 ps and 500 ps, taking into account that different LUT inputs have different delays.

Although the area and delays of the AIC cluster illustrated in FIG. 8 are described above using certain modeling techniques, it should be appreciated by those skilled in the art that other modeling techniques and algorithms may be used and that the area and delay determinations presented in Tables 2 and 3 and described may change based on the modeling technique, technology, and implementation of the AIC.

In an illustrative embodiment, the AICs may be implemented as one or more shadow clusters and/or combined with other blocks in FPGAs, for example, but not limited to, Digital Signal Processing (DSP) blocks and LUTs. In general, a shadow cluster is a standard FPGA logic cluster, typically consisting of a group of LUTs and flip-flops, that is placed within the same logical tile as a circuit and can be programmed to replace the circuit when the circuit is not needed. See P. Jamieson and J. Rose, "Enhancing the Area Efficiency of FPGAs With Hard Circuits Using Shadow Clusters," IEEE Transactions on Very Large Scale Integration (VLSI) Systems, 18(12): 1696-1709, December 2010, the contents of which are incorporated herein by reference in their entirety. The disclosed AIC(s) can replace or supplement the LUTs in a shadow cluster and be implemented in an FPGA.

The new logic blocks (AICs), described herein, which are natural configurable circuit homologues of the AIGs seek to cure the issues associated with LUTs. Additionally, alternate FPGAs architectures based on these AICs are also disclosed herein, essentially fitting the AICs into a traditional FPGA architecture without changing some global parameters. On one hand, delay is bound to decrease as both logic delay and the number of logic blocks on the critical path is reduced. Using a fairly rough routing delay model, a delay reduction of about 25-30% is observed. On the other hand, the number of logic blocks (all of similar area) consumed by the benchmark circuits is also generally reduced; with one of the mapping approaches, the area is reduced on average by about 16%.

Although the AICs are described herein as the sole components of new FPGAs, the AICs may be used as logic blocks for a hybrid FPGA made of both LUTs and AICs. Additionally, although the AICs are described herein as implemented in FPGAs, those of ordinary skill in the art should appreciate that the AICs may be implemented in other programmable design approached, for example structured Application-Specific Integrated Circuits (ASICs).

Although the new logic block is described herein as an AND-Inverter Cone (AIC), in Boolean algebra there is perfect duality between AND and OR. For example, an OR gate with all inputs inverted, a Negative-OR gate, behaves the same as a NAND gate, and an AND gate with all inputs inverted, a Negative-AND gate, behaves the same as a NOR gate. Thus, designing an AND-Inverter Cone (AIC) and an OR-Inverter Cone (OIC) is equivalent for any practical purpose. The difference is merely that the OIC includes OR and/or NOR gates instead of AND and/or NAND gates. Therefore, the AND-Inverter Cones (AICs) and OR-Inverter Cones (OICs) are interchangeable with one another, and the disclosure should not be limited to AICs. Similarly, other logic blocks may be functionally equivalent and interchangeable with the AICs disclosed herein. For example, one of skill in the art would understand that in addition to being functionally equivalent to OICs, logic blocks including AICs may be functionally equivalent to logic blocks employing exclusive OR (XOR) gates, inverted exclusive OR (XNOR) gates, majority gates, minority gates and any combination thereof. Therefore, any combination of the abovementioned gates may be supported by the present disclosure without departing from the example embodiments.

In addition to example embodiments incorporating any logic blocks functionally equivalent to the AICs, example embodiments may also include a variety of tree structures. For example, while some of the example embodiments illustrate a binary tree structure having two inputs to every node, example embodiments are not limited thereto and may include any hierarchical tree data structure. Therefore, some logic blocks may include binary tree structures having two inputs to every node, ternary tree structures having three inputs to every node and/or K-ary tree structures having K inputs to every node. Further, some logic blocks may have an overlapping tree structure arrangement, such that an output of a single node in a level may go to two subsequent nodes in the intermediary level.

As discussed above, while logic blocks may include AICs having two-input AND gates, some logic blocks may include multiple-input logic gates of any variety, such as three-input AND gates or 3-input or 5-input majority or minority gates. For simplicity of explanation, the following figures will reference a general logic block instead of being limited to an AIC, and while the illustrated examples may be tailored to a particular logic gate, any logic gate may be used without departing from the example embodiments of the present disclosure.

An architecture of a logic block 900 having a depth of three or three levels of cells according to an illustrative embodiment is described with reference to FIG. 9. As illustrated in FIG. 9, the logic block 900 may include seven cells 902. As illustrated in FIG. 9, there are four cells 902 in a top or lowest level 912, two cells 902 in an intermediary level 914 and one cell 902 in a bottom level 916. Thus, the logic block 900 may include eight inputs (i0-i7), two for each cell 902 in the top level 912.

Further, except for the cells 902 at the top level 912 of the logic block 900, each cell 902 in the intermediary level 914 and the bottom level 916 generates an output (O0-O2). Thus the logic block 900 may include three outputs (O0-O2), with two of the outputs (O1-O2) being from the intermediary level 914 and one output (O0) from the bottom level 916. This provides access to intermediate nodes and may enable a larger logic block to be configured as multiple smaller logic blocks, as discussed above with regard to FIG. 1.

In the example embodiment illustrated in FIG. 9, each cell 902 may be configured as either a two-input NAND or AND gate in one of three configurations (902A, 902B, 902C). These configurations represent programmably selectable inverters located at the input of the cell, located at the input and the output of the cell and located only at the output of the cell, respectively. While each of the three configurations are shown on separate levels within the logic block 900 illustrated in FIG. 9, example embodiments may vary and are not limited thereto. For example, while FIG. 9 shows the top level 912 using the configuration of 902A, the top level 912 may instead use configurations of 902B, 902C, or a combination thereof. Similarly, while the intermediary level 914 is shown using the configuration of 902B, the intermediary level 914 may use any of configurations 902A, 902B, 902C or a combination thereof. Therefore, each of the top level 912, intermediary level 914 and the bottom level 916 may use any combination of the configurations 902A, 902B and 902C without departing from the example embodiments of the present disclosure.

Each cell 902 in the top level 912 is shown as using configuration 902A, which includes programmably selectable inverters on an input side of a logic gate within the cell 902. For example, the cell 902A may include two inputs and each input may be coupled to a multiplexer (MUX) 908 both directly and through an inverter 906. Each MUX 908 may be configured to receive a select signal 910 for enabling or disabling the inverter 906. For example, if the select signal 910 is low, the MUX 908 may output the non-inverted input, whereas if the select signal 910 is high, the MUX 908 may output the inverted signal generated by the inverter 906. Finally, an output of each MUX 908 may be coupled to a logic gate, such as a NAND gate 904, and the output of the NAND gate 904 may be the output of the cell 902A.

Each cell 902 in the intermediary level 914 is shown as using configuration 902B, which includes programmably selectable inverters on an input side and an output side of a logic gate within the cell 902. For example, the cell 902B may include two inputs and each input may be coupled to a multiplexer (MUX) 908 both directly and through an inverter 906. The MUX 908 may be configured to receive a select signal 910 for enabling or disabling the inverter 906. For example, if the select signal 910 is low, the MUX 908 may output the non-inverted input, whereas if the select signal 910 is high, the MUX 908 may output the inverted signal generated by the inverter 906. An output of each MUX 908 may be coupled to a logic gate such as a NAND gate 904. The NAND gate 904 may perform a NAND operation on the signals and the output of the NAND gate 904 may be coupled to a MUX 908 both directly and through an inverter 906. As discussed above, the MUX 908 may be configured to receive a select signal 910 for enabling or disabling the inverter 906. Therefore, the output of the cell 902B may be the output of the NAND gate 904 or an inverted output of the NAND gate 904 depending on the select signal 910.

Each cell 902 in the bottom level 916 is shown as using configuration 902C, which includes programmably selectable inverters on only an output side of a logic gate within the cell 902. For example, the cell 902C may include two inputs and each input may be coupled directly to a logic gate such as a NAND gate 904. The NAND gate 904 may perform a NAND operation on the inputs and the output of the NAND gate 904 may be coupled to a MUX 908 both directly and through an inverter 906. The MUX 908 may be configured to receive a select signal 910 for enabling or disabling the inverter 906. Therefore, the output of the cell 902C may be the output of the NAND gate 904 or an inverted output of the NAND gate 904 depending on the select signal 910.

Figure 10B:
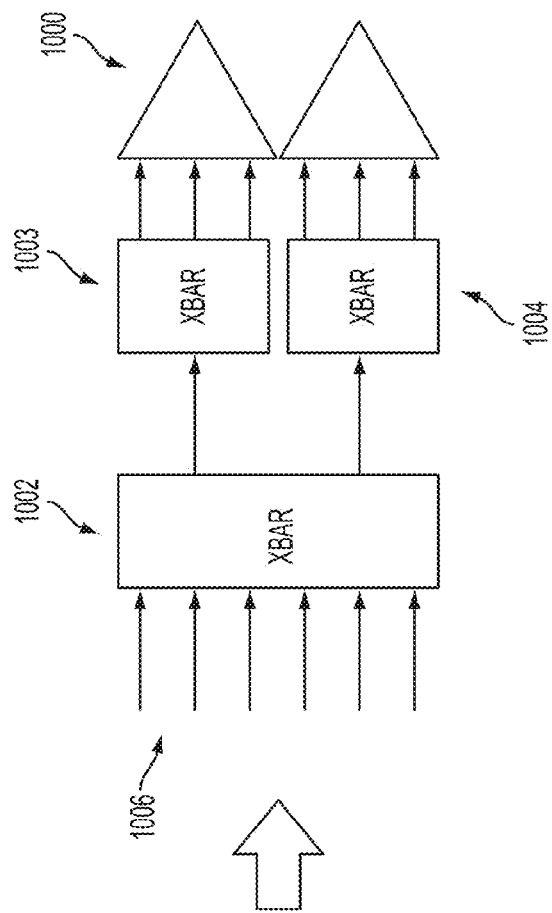
FIG. 10B illustrates a cascaded input crossbar structure coupled to a logic block.
Figure 10A:
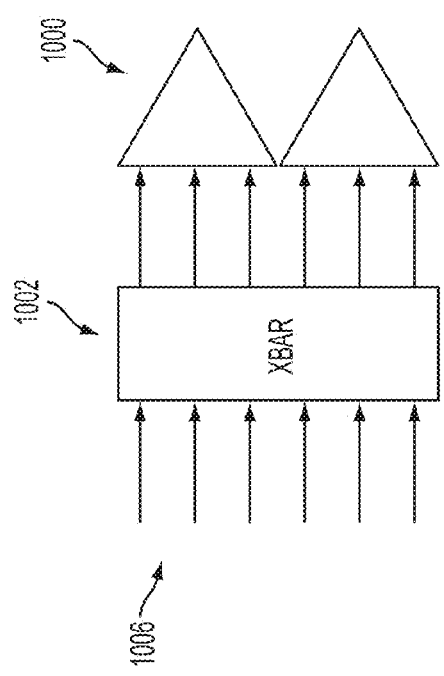
FIG. 10A illustrates a simple input crossbar structure coupled to a logic block.

FIG. 10A illustrates an input crossbar structure, including logic blocks 1000 and a first crossbar 1002. The logic blocks 1000 may be interconnected through the first crossbar 1002. For example, the first crossbar 1002 may take inputs 1006 and/or outputs of the logic blocks 1000 and may route these signals to various inputs of the logic blocks 1000. Thus, the first crossbar 1002 may route any input to the crossbar to any output of the crossbar.

FIG. 10B illustrates a cascaded input crossbar structure, including logic blocks 1000, a first crossbar 1002, a second crossbar 1003 and a third crossbar 1004. The logic blocks 1000 may be interconnected through the first crossbar 1002, the second crossbar 1003 and the third crossbar 1004. For example, the first crossbar 1002 may take inputs 1006 and/or outputs of the logic blocks 1000 and may route these signals to various inputs of the second crossbar 1003 and the third crossbar 1004. The second crossbar 1003 may take the output of the first crossbar 1002 and/or outputs of the logic blocks 1000 and may route these signals to various inputs of the top logic block 1000. The third crossbar 1004 may take the output of the first crossbar 1002 and/or outputs of the logic blocks 1000 and may route these signals to various inputs of the bottom logic block 1000. Thus, the number of inputs to the second crossbar 1003 and the third crossbar 1004 may be substantially similar to the number of inputs to each of the logic blocks 1000. By splitting the second stage of the cascaded crossbar into the second crossbar 1003 and the third crossbar 1004, an area of the crossbar section may be reduced relative to having the second stage the same size as the first crossbar 1002. However, example embodiments are not limited thereto and may vary. For example, the number of inputs to the second crossbar 1003 and the third crossbar 1004 may be roughly half the number of inputs to each of the logic blocks 1000 for additional space reduction.

Figure 11B:
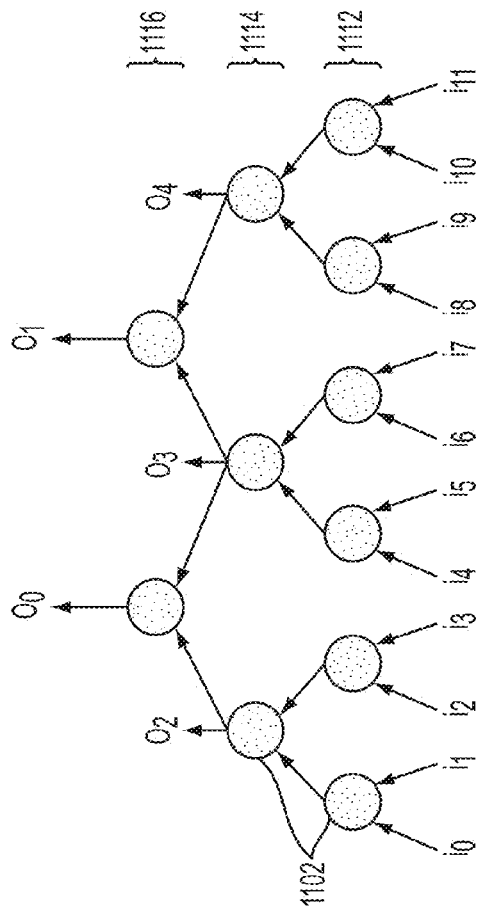
FIG. 11B illustrates an overlapping tree structure arrangement between cells in a logic block.
Figure 11A:
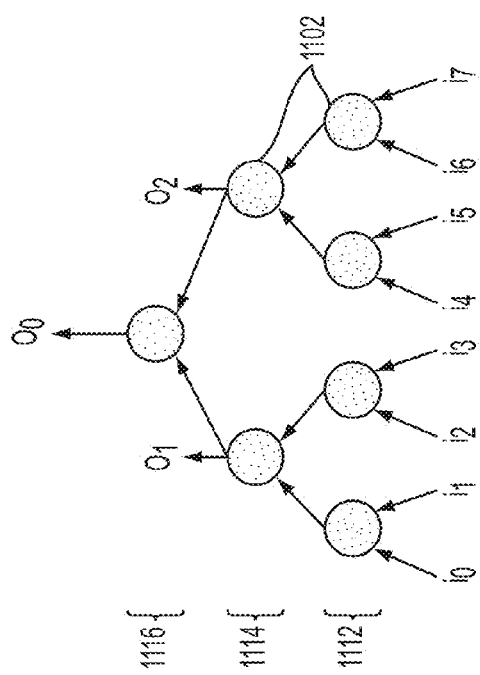
FIG. 11A illustrates a traditional tree structure arrangement between cells in a logic block.

FIG. 11A illustrates a tree structure arrangement between the cells 1102 in the logic block 1100. For example, the top layer 1112 may include four cells 1102, and each of the cells 1102 may be coupled to two inputs from the inputs (i0-i7) to the logic block 1100. Each of the cells 1102 in the top layer 1112 may output to a single cell 1102 in the intermediary layer 1114 such that the top layer 1112 has twice the number of cells 1102 as the intermediary layer 1114. Each of the cells 1102 in the intermediary layer 1114 may receive two inputs and may output to a single cell 1102 in the bottom layer 1116, such that the intermediary layer has twice the number of cells 1102 as the bottom layer 1116. Thus, the logic block 1100 illustrated in FIG. 11A may include eight inputs (i0-i7) and three outputs (O0-O2) as a result of the tree structure arrangement.

FIG. 11B illustrates an overlapping tree structure arrangement between the cells 1102 in the logic block 1100. For example, the top layer 1112 may include six cells 1102, and each of the cells 1102 may be coupled to two inputs from the inputs (i0-i11) to the logic block 1100. However, unlike the tree structure arrangement of FIG. 11A, each of the cells 1102 in the top layer 1112 may output to at least one cell 1102 in the intermediary layer 1114. Thus, while FIG. 11B illustrates the top layer 1112 having twice the number of cells 1102 as the intermediary layer 1114, example embodiments are not limited thereto and there might be overlap between some of the cells 1102 in the top layer 1112 (or other layers). Each of the cells 1102 in the intermediary layer 1114 may receive two inputs and may output to at least one cell 1102 in the bottom layer 1116. As illustrated in FIG. 11B, the fourth output O3 may be output to both of the cells 1102 in the bottom layer 1116. As a result of this overlap, the intermediary layer 1114 may have three cells 1102 while the bottom layer 1116 may have two cells 1102. Therefore, the logic block 1100 illustrated in FIG. 11B may include twelve inputs (i0-i11) and five outputs (O0-O4) as a result of the overlapping tree structure arrangement. This overlapping tree structure arrangement may be expressed as having a fixed Boolean function of m-outputs per cell, resulting in an overlapping tree structure when m>1.

Figure 12A:
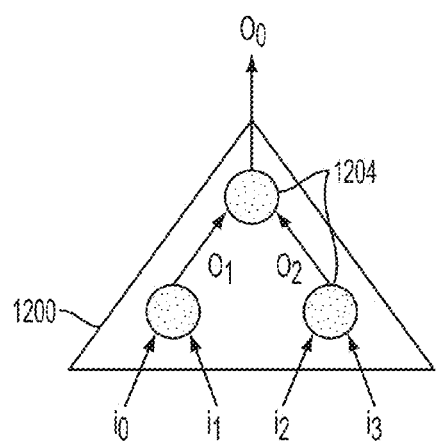
FIG. 12A illustrates a logic block having binary input cells.

FIG. 12A illustrates a logic block having binary input cells. The logic block 1200 may have four inputs (i0-i3) coupled to two binary input cells 1204 in a top level, each of the binary input cells 1204 coupled to a binary input cell 1204 in a bottom level. Due to the binary input structure, each successive level of cells may have half the number of cells as the prior level.

Figure 12B:
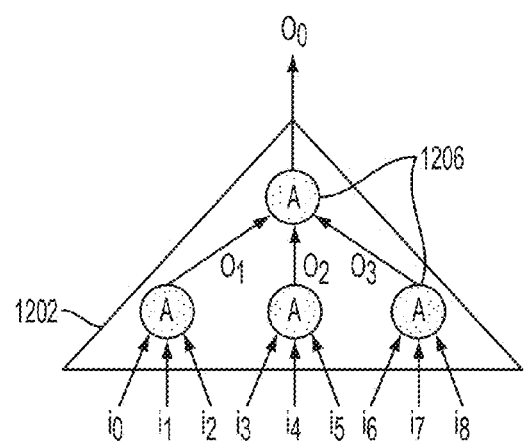
FIG. 12B illustrate a logic block having ternary input cells.

FIG. 12B illustrates a logic block 1202 having ternary input cells. The logic block 1202 may have nine inputs (i0-i8) coupled to three ternary input cells 1206 in a top level, each of the ternary input cells 1206 coupled to a ternary input cell 1206 in a bottom level. Due to the ternary input structure, each successive level of cells may have a third of the number of cells as the prior level.

While FIG. 12B illustrates ternary input cells, example embodiments may vary and are not limited thereto. Instead, some example embodiments may include logic blocks having n inputs, where n is a natural number. This hierarchical tree structure arrangement may be expressed as having a fixed Boolean function of n-inputs, resulting in a non-binary tree structure when n>2. For example, a logic block including majority (or minority) gates may have 3, 5 or any odd number of inputs. As discussed above, example embodiments are not limited to a particular logic gate and any number of inputs may be used with any potential logic gate.

Although the systems, methods, and apparatuses disclosed herein has been described and illustrated in connection with preferred embodiments, many variations and modifications will be evident to those skilled in the art and may be made without departing from the spirit and scope of the disclosure. The disclosure is thus not to be limited to the precise details of methodology or construction set forth above as such variations and modification are intended to be included within the scope of the disclosure.

What is claimed is:

1. A logic block implemented in an integrated circuit, comprising:
    a plurality of cells formed in said integrated circuit, each of said cells consisting of data inputs, one or more select inputs, one of a logic gate and the functional equivalent of the logic gate, and one or more programmably selectable inverters coupled to said logic gate, each of said data inputs to said cell consisting only of an input to at least one of said logic gate and one of said one or more programmably selectable inverters, said logic gate including a logic gate output coupled to one of an output of said cell and one of said one or more programmably selectable inverters, said one or more select inputs configured for enabling or disabling each of said one or more programmably selectable inverters;
    a tree structure arrangement comprising a number of levels formed by said cells;
    a plurality of inputs to said tree structure in a first level of said tree structure comprising said data inputs to said cells in said first level; and
    an output from said tree structure in a last level of said tree structure.

2. The logic block of claim 1, wherein each of said data inputs to said logic cell are coupled to a first programmably selectable inverter of the one or more programmably selectable inverters, an output of said first programmably selectable inverter being coupled to said logic gate.

3. The logic block of claim 2, wherein
    said logic gate output is coupled to a second programmably selectable inverter, and
    an output of said second programmably selectable inverter is coupled to said output of said cell.

4. The logic block of claim 1, wherein said one or more programmably selectable inverters includes,
    an inverter configured to invert an input of said one or more programmably selectable inverters,
    a multiplexer coupled to said input of said one or more programmably selectable inverters and an output of said inverter, said multiplexer configured to enable or disable the inverter based on one of said one or more select inputs.

5. The logic block of claim 1, wherein said tree structure is a binary tree structure.

6. The logic block of claim 1, wherein said tree structure is an overlapping tree structure arrangement, in which at least one output in a level of said number of levels is used as a data input to two or more cells in a subsequent level of said number of levels.

7. The logic block of claim 1, wherein at least one of said cells is configurable as a bypass.

8. The logic device of claim 1, wherein said plurality of inputs to said tree structure includes two or more inputs to each of said cells in said first level.

9. The logic block of claim 1, further comprising an intermediary output from one or more cells in at least one intermediary level between said first level and said last level.

10. The logic block of claim 9, wherein:
    said plurality of inputs to said tree structure includes at least eight inputs, and
    said intermediary output includes at least two intermediary outputs from said at least one intermediary level.

11. The logic block of claim 1, further combined in a Field-Programmable Gate Array integrated circuit with at least one of a Digital Signal Processing structure and a Look-Up Table structure.

12. A programmable circuit, comprising:
    an input crossbar including an input crossbar input and an input crossbar output; and
    a logic block coupled with said input crossbar, said logic block including:
        a plurality of cells, each of said cells consisting of data inputs, one or more select inputs, one of a logic gate and the functional equivalent of the logic gate, and one or more programmably selectable inverters coupled to said logic gate, each of said data inputs to said cell consisting only of an input to at least one of said logic gate and one of said one or more programmably selectable inverters, said logic gate including a logic gate output coupled to one of an output of said cell and one of said one or more programmably selectable inverters, said one or more select inputs configured for enabling or disabling each of said one or more programmably selectable inverters, said cells forming a tree structure arrangement comprising a number of levels,
        a plurality of inputs to said tree structure in a first level of said tree structure comprising said data inputs to said cells in said first level, said logic block input coupled with said input crossbar output, and
        a logic block output from said tree structure in a last level of said tree structure.

13. The programmable circuit of claim 12, further comprising a logic block crossbar having a logic block crossbar input and a logic block crossbar output, said logic block crossbar input in communication with said logic block output.

14. The programmable circuit of claim 13, further comprising an output crossbar coupled to said logic block crossbar output.

15. The programmable circuit of claim 12, further comprising:
one or more first crossbars including one or more first crossbar inputs coupled to said input crossbar output and one or more first crossbar outputs coupled to said plurality of inputs to said tree structure, a number of inputs to said one or more first crossbars substantially similar to said plurality of inputs to said tree structure.

16. The programmable circuit of claim 15, wherein a number of inputs to said input crossbar is approximately double said number of inputs to said one or more first crossbars.

17. The programmable circuit of claim 12, further comprising a Look-Up Table (LUT) in communication with said input crossbar.

18. The programmable circuit of claim 12, wherein:
said tree structure includes said first level, said last level, and an intermediary level, and
an intermediary output from said intermediary level.

19. A programmable circuit, comprising:
a first logic block including:
a plurality of cells including a first group of said cells arranged in a first tree structure having a first intermediary level, each of said cells consisting of data inputs, one or more select inputs, one of a logic gate and a functional equivalent of the logic gate, and one or more programmably selectable inverters coupled to said logic gate, each of said data inputs to said cell consisting only of an input to at least one of said logic gate and one of said one or more programmably selectable inverters, said logic gate including a logic gate output coupled to one of an output of said cell and one of said one or more programmably selectable inverters, said one or more select inputs configured for enabling or disabling each of said one or more programmably selectable inverters,
first inputs to said first group of said cells, and
first outputs from said first group of said cells, said first outputs including a first intermediary output from said first intermediary level; and
a second logic block interconnected with the first logic block, said second logic block including:
second group of said cells arranged in a second tree structure having a second intermediary level,
second inputs to said second group of said cells, and
second outputs from said second group of said cells, said second outputs including a second intermediary output from said second intermediary level.

20. The logic block of claim 1, wherein said logic gate is a member of the group consisting of AND gates, OR gates, NAND gates, NOR gates, exclusive OR (XOR) gates, inverted exclusive OR (XNOR) gates, majority gates and minority gates.

21. The logic block of claim 12, wherein said logic gate is a member of the group consisting of AND gates, OR gates, NAND gates, NOR gates, exclusive OR (XOR) gates, inverted exclusive OR (XNOR) gates, majority gates and minority gates.

22. The logic block of claim 19, wherein said logic gate is a member of the group consisting of AND gates, OR gates, NAND gates, NOR gates, exclusive OR (XOR) gates, inverted exclusive OR (XNOR) gates, majority gates and minority gates.

* * * * *